US008309470B2

(12) United States Patent
O'Donnell

(10) Patent No.: US 8,309,470 B2
(45) Date of Patent: Nov. 13, 2012

(54) IN-SITU RECLAIM OF VOLATILE COMPONENTS

(75) Inventor: Robert O'Donnell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 940 days.

(21) Appl. No.: 11/641,377

(22) Filed: Dec. 18, 2006

(65) Prior Publication Data

US 2008/0142053 A1  Jun. 19, 2008

(51) Int. Cl.
*H01L 21/311* (2006.01)
*H01L 21/302* (2006.01)

(52) U.S. Cl. .............. 438/745; 216/83; 216/84; 216/93; 134/900

(58) Field of Classification Search ........................ None
See application file for complete search history.

(56) References Cited

U.S. PATENT DOCUMENTS

| 6,199,298 | B1 * | 3/2001 | Bergman ........................ 34/315 |
| 2005/0217703 | A1 | 10/2005 | O'Donnell ........................ 134/21 |
| 2005/0221621 | A1 | 10/2005 | Mikhaylichenko et al. .. 438/745 |
| 2006/0124153 | A1 | 6/2006 | Yun et al. ........................ 134/2 |

* cited by examiner

*Primary Examiner* — Michael Barr
*Assistant Examiner* — Jason Ko
(74) *Attorney, Agent, or Firm* — Martine Penilla and Group, LLP

(57) ABSTRACT

Methods, apparatus, and systems are provided for efficiently reclaiming solvents used to clean surfaces of semiconductor wafers, etc. More particularly, embodiments of the present invention provide an in-situ reclaim approach that utilizes condensing mechanisms to reclaim evaporated solvent components. In these embodiments, the condensing can occur within a proximity head itself and/or along a vacuum line running from the proximity head to a vacuum tank. Other embodiments of the present invention provide an in-situ reclaim approach that prevents the evaporation of solvents at the onset by maintaining appropriate equilibrium gas phase concentrations between the liquid chemistries and gases used to process wafer surfaces.

11 Claims, 7 Drawing Sheets

IN-SITU RECLAIM OF VOLATILE COMPONENTS

BACKGROUND

1. Field of the Invention

The invention relates generally to semiconductor wafer processing and, more particularly, to apparatus and methods for eliminating chemical loss during the cleaning of semiconductor wafer surfaces.

2. Description of the Related Art

In electronic device manufacturing operations, expensive proprietary chemical mixtures or blends customarily referred to as "solvents" or "proprietary solvents" are widely used to remove particulate contaminants, post-etch residue, and metal contamination from semiconductor wafer surfaces. Such chemical solvents generally fall into two generic classes: "aqueous-based" solvents and "organic-based" solvents. Aqueous-based solvents are cleaning chemistries which are water-based (i.e. are up to 95% water by weight with the active chemical agents making up the remainder). Organic-based solvents are cleaning chemistries for which water is replaced by a liquid organic chemical, or mixtures thereof, that also contains active chemical agents for cleaning semiconductor wafer surfaces. Because of the expense of obtaining these solvents, they are typically reclaimed after processing and re-used. For example, FIG. 1 illustrates a conventional liquid chemical reclaim system 100. In FIG. 1, a chemical solvent is applied to a surface 104 of a semiconductor wafer 106 from a supply tank 108 via a supply line 112, to create a chemical meniscus 102. The chemical meniscus 102 acts to clean the semiconductor wafer surface 104. Ambient air flow (not shown) is applied to the chemical meniscus 102 to prevent the meniscus 102 from breaking out of a defined footprint and flooding the semiconductor wafer surface 104. As the proximity head 110 moves along the semiconductor wafer surface 104, the chemical solvent of the meniscus 102 operates on the semiconductor wafer surface 104. The chemical solvent is removed from the semiconductor wafer surface 104 using a vacuum mechanism. Specifically, this vacuum mechanism draws the air and chemical solvent from the surface 104 of the semiconductor wafer 106, out of the proximity head 110, and into a vacuum tank 114 via an air-liquid return line 116 coupled to the vacuum tank 114. At the vacuum tank 114, the chemical solvent is separated from the air and the air is pumped out of the vacuum tank 114 via an exhaust 118. Reclaim of the chemical solvent is achieved by recirculation of the chemical solvent from the vacuum tank 114 back to the supply tank 108 via a liquid pump 120.

Evaporation of the chemical solvent in conventional liquid reclaim systems similar to the system 100 illustrated in FIG. 1 is a serious issue. Such evaporation can result in significant changes in cleaning performance due to chemical solvent depletion and/or excessive concentration of chemicals. Chemical solvent depletion occurs because, during standard operation, there is a significant mixing of the chemical meniscus liquid and the ambient air on the way to the vacuum tank 114. Therefore, the air (gas) stream that exists in the vacuum tank 114 through the exhaust 118 is saturated with every component of the volatile chemical solvent. And the chemical solvent included in the saturated gas (air) stream is not reclaimed once the saturated gas (air) stream is out of the vacuum tank 114 and before the saturated gas (air) stream is sent to purification scrubbers.

Excessive concentration of chemicals, on the other hand, commonly results with the use of proprietary solvents. Proprietary solvents contain non-volatile components and, if the proprietary solvent is aqueous-based, evaporation causes the concentration of non-volatile components to increase over time. This increase in the concentration of non-volatile components can adversely affect the cleaning performance of the chemical solvent. Moreover, damage to the semiconductor wafer 106 can result if the concentration of non-volatile components increases too much. Additionally, proprietary solvents are commonly used at elevated temperatures, (e.g. 30 degrees Celsius to 60 degrees Celsius) to get improved cleaning performance. Since evaporation is determined by vapor pressure, which exponentially increases with temperature, chemical loss can dramatically increase, causing a corresponding dramatic decrease in the usable lifetime of a chemical solvent bath.

In view of the foregoing, there is a need for a reclaiming approach that reduces chemical loss due to evaporation and other sources.

SUMMARY

In one embodiment, the present invention provides fluid reclaim system. The fluid reclaim system comprises a proximity head capable of generating a fluid meniscus on a surface of a wafer wherein a gas is applied to the fluid meniscus to confine the fluid meniscus to a footprint on the wafer surface. The proximity head includes at least one outlet configured to remove a fluid chemistry from the wafer surface, wherein removal of the fluid chemistry creates a mixture of the gas and the fluid chemistry in the at least one outlet. The proximity head also includes a heat exchanging element coupled to an inner surface of the at least one outlet, wherein the heat exchanging element is capable of cooling the mixture of the gas the fluid chemistry to prevent evaporation loss of the fluid chemistry.

In another embodiment, the present invention provides a proximity head capable of generating a fluid meniscus on a surface of a wafer from a fluid chemistry, wherein a gas is applied to the fluid meniscus to confine the fluid meniscus to a footprint on the wafer surface. The proximity head comprises at least one outlet configured to remove the fluid chemistry from the wafer surface, wherein removal of the fluid chemistry creates a mixture of the gas and the fluid chemistry in the at least one outlet. The proximity head also comprises a heat conducting channel including an entrance and an exit opposite the entrance, wherein the heat conducting channel is monolithically integrated within the proximity head, and wherein the heat conducting channel is capable of cooling the proximity head to prevent evaporation loss of the fluid chemistry included in the mixture of the gas and the fluid chemistry.

In yet another embodiment, the present invention provides a method for preventing evaporation loss of a liquid chemistry. The method comprises applying a gas to a meniscus formed on a surface of a wafer, wherein the gas is selectively saturated with a component. The method also comprises supplying a liquid chemistry to form the meniscus on the wafer surface, wherein the liquid chemistry includes the component, and wherein a concentration of the component in the gas and a concentration of the component in the liquid chemistry are provided to produce a gas phase equilibrium that prevents evaporation of the liquid chemistry during a mixing of the gas and the liquid chemical.

Other aspects and advantages of the invention will become apparent from the following detailed description, taken in conjunction with the embodiments and accompanying drawings, illustrating, by way of example, the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Embodiments of the present invention provide systems, apparatus, and methods for efficiently reclaiming solvents used to clean surfaces of semiconductor wafers, etc. More particularly, embodiments of the present invention provide an in-situ reclaim approach that utilizes condensing mechanisms to reclaim evaporated solvent components. In these embodiments, the condensing can occur within a proximity head itself and/or along a vacuum line running from the proximity head to a vacuum tank. Other embodiments of the present invention provide an in-situ reclaim approach that prevents the evaporation of solvents at the onset by maintaining appropriate equilibrium gas phase concentrations between the liquid chemistries and gases used to process wafer surfaces.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention. The present invention includes several aspects and is presented below and discussed in connection with the Figures and embodiments.

Figure 1:
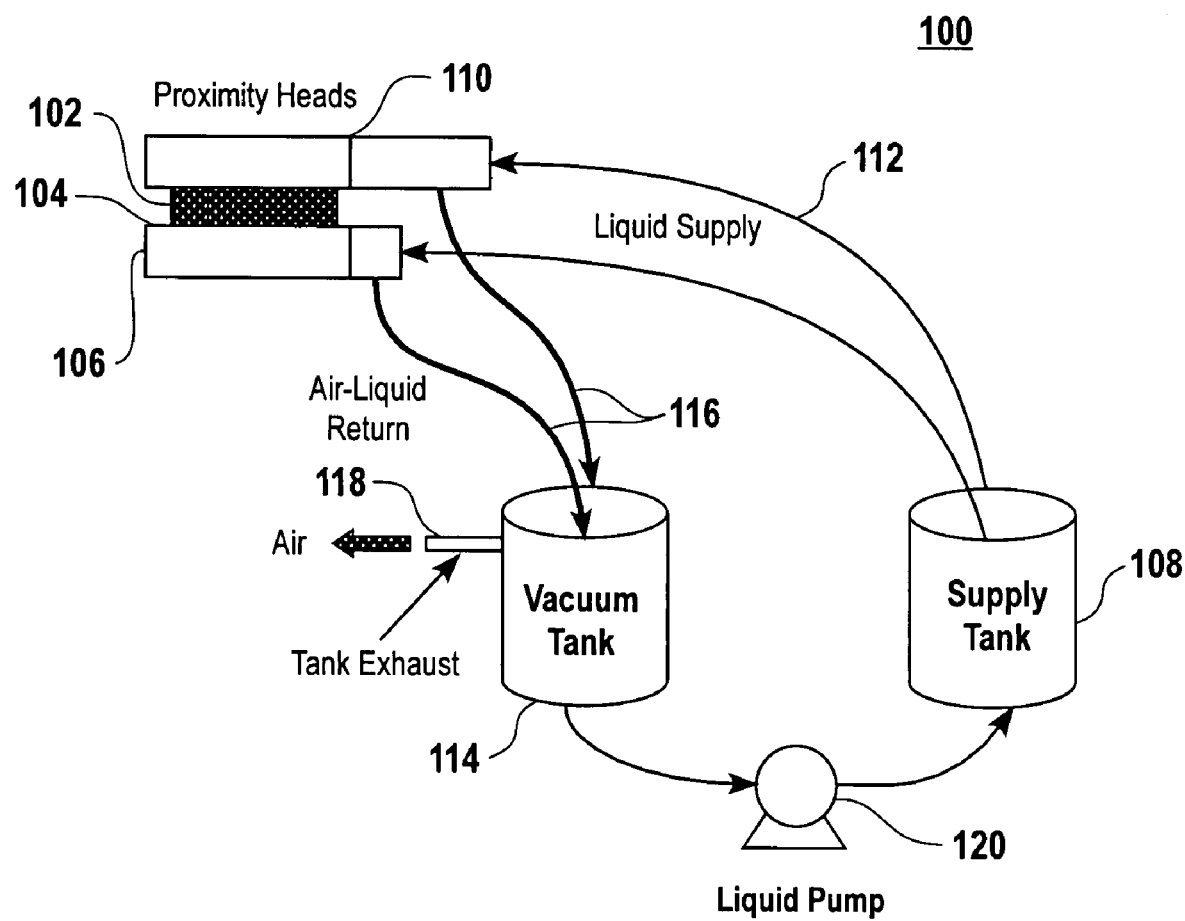
FIG. 1 is block illustration of a conventional liquid chemical reclaim system.
Figure 2:
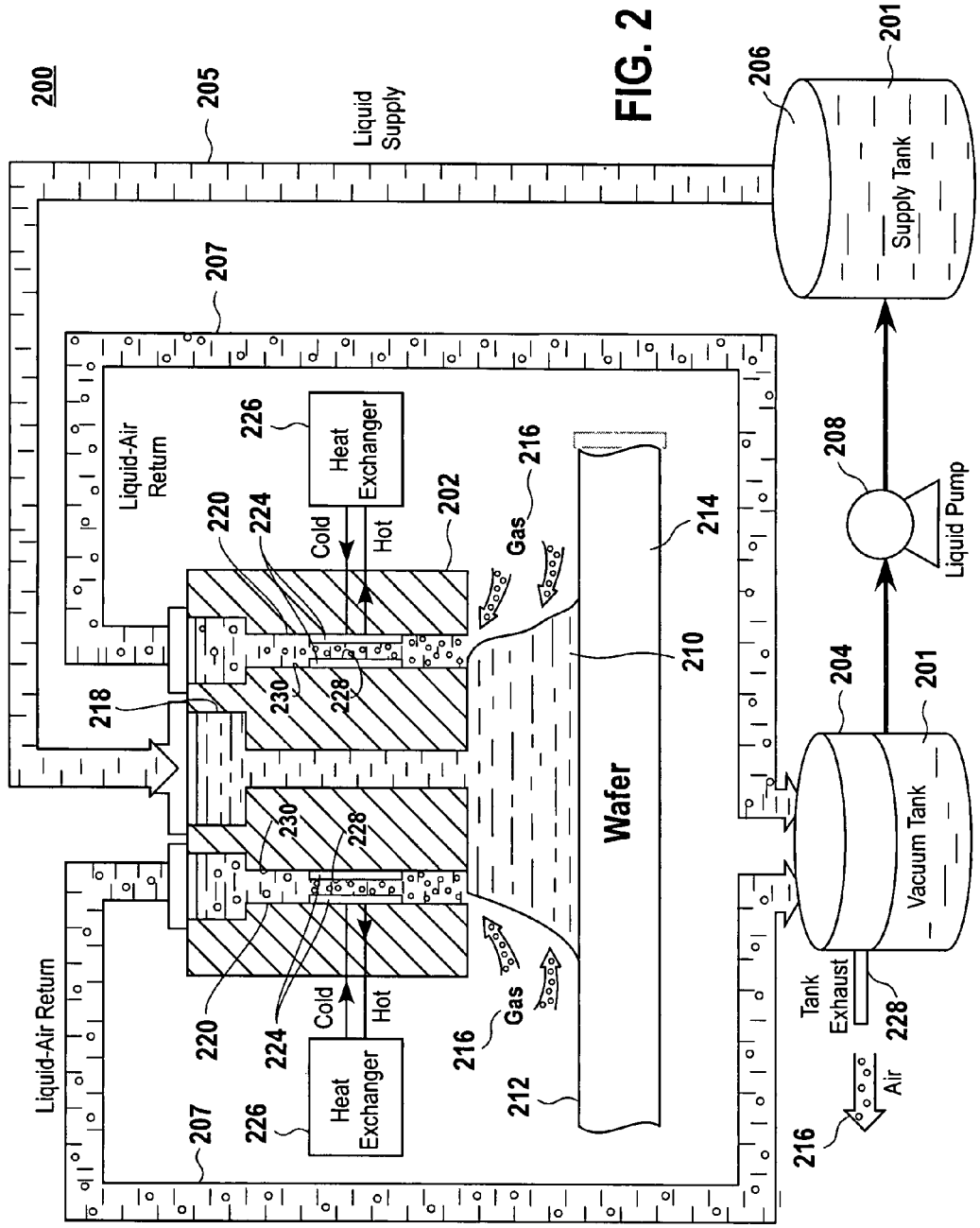
FIG. 2 is a block and cross-sectional view illustration of an in-situ reclaim system, in accordance with one embodiment of the present invention.
Figure 3:
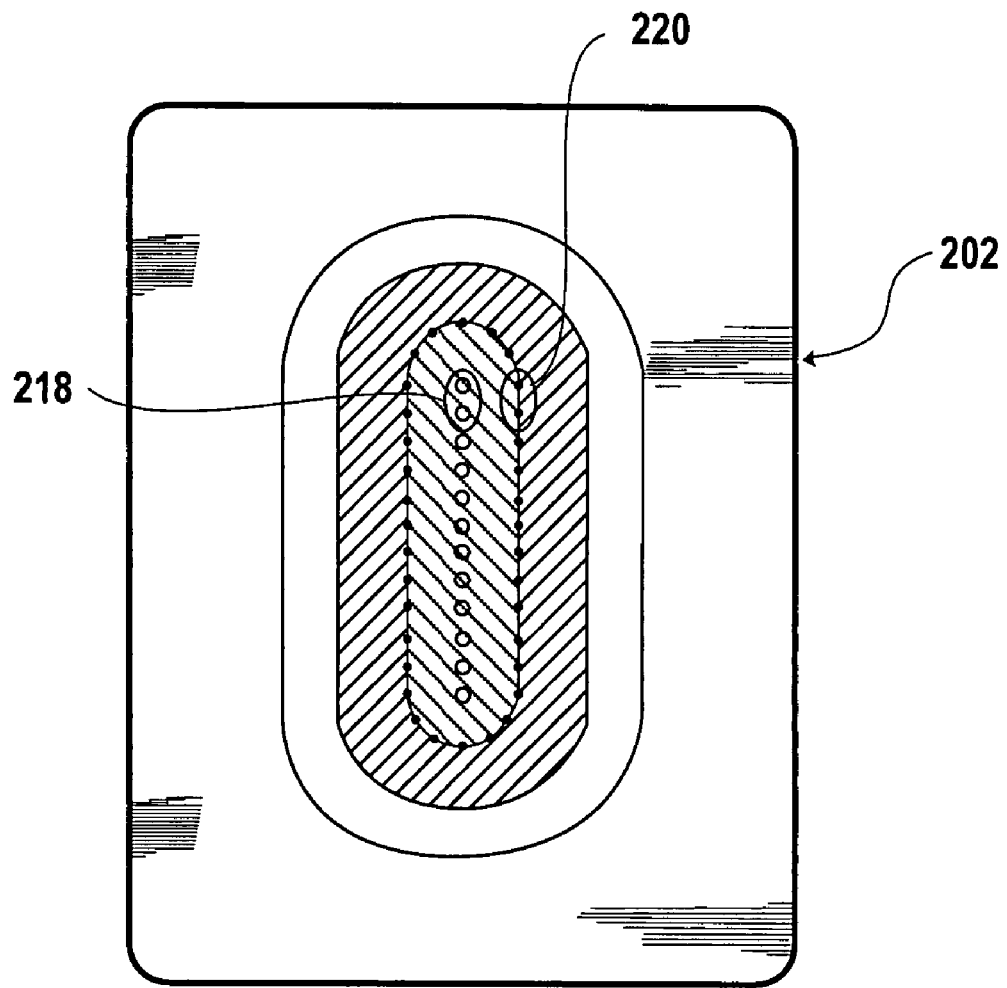
FIG. 3 is an illustration of an exemplary two-phase proximity head.

In FIG. 2, according to one embodiment of the present invention, a liquid chemical in-situ reclaim system 200 is illustrated. The system 200 includes a proximity head 202, and a vacuum tank 204 coupled to a supply tank 206. The supply tank 206 is coupled to an inlet 218 of the proximity head 202 via a supply line 205. The vacuum tank 204 is coupled to one or more outlets (or return manifolds) 220 included in the proximity head 202 via a vacuum return line 207. The vacuum tank 204 can be coupled to the supply tank 206 via a liquid pump 208. In the system 200, a liquid chemistry 201 is supplied to a chemical meniscus 210 from the supply tank 206. More particularly, the liquid chemistry 201 is supplied to the meniscus 210 via the fluid inlet 218 of the proximity head 202 where the liquid chemistry 201 travels along the fluid inlet 218 to form the meniscus 210 on a surface 212 of a semiconductor wafer 214. In one embodiment, gas 216 is applied to the chemical meniscus 102 to prevent the meniscus 210 from breaking out of a defined footprint and flooding the semiconductor wafer surface 212. In one embodiment of the present invention, the gas 216 can be ambient air, or inert gases such as nitrogen, helium, argon, etc. Also, the gas 216 can be "spiked" with water vapor or volatile organic components such as ammonia, solvents, etc. However, embodiments of the present invention are not limited to a particular type of gas 216. As the proximity head 202 moves along the semiconductor wafer surface 212, the liquid chemistry 201 operates on the semiconductor wafer surface 212 to process (e.g. clean, dry, etc.) the semiconductor wafer surface 212. A top-view illustration of an exemplary two-phase proximity head 202 like that shown in FIG. 2, including concentric fluid inlets 218 and outlets 220, is illustrated in FIG. 3.

However, embodiments of the present invention are not limited to the particular type of proximity head 202 illustrated in FIG. 2. For example, various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method." Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." The aforementioned patent applications are hereby incorporated by reference in their entirety.

Referring still to FIG. 2, during processing, the liquid chemistry 201 of the meniscus 210 is continuously removed from the semiconductor wafer surface 212 via the outlets 220. However, because the gas 216 is being applied to the meniscus 210 to confine its footprint, the air 216 and the liquid chemistry 201 mix in the outlets 220 and the vacuum lines 207. This mixing of the liquid chemistry 201 and the air 216 can act to increase the efficiency of the evaporation of the liquid chemistry 201, especially if the gas 216 is dry. The efficiency of the evaporation of the liquid chemistry 201 is also increased in proportion to the internal surface area of the proximity head 202 along which the liquid chemistry 201/gas 216 mixture travels. Therefore, according to one embodiment of the present invention, the liquid chemistry 201/gas 216 mixture is cooled to prevent evaporation of the liquid chemistry 201. In particular, one or more heat exchanging elements 224 can be configured along inner surfaces 230 of the outlets 220 so that a surface 228 of each heat exchanging element 224 directly contacts the liquid chemistry 201/gas 216 stream. In one embodiment, each heat exchanging element 224 is coupled to a heat exchanger 226 that is capable of supplying a cold medium to the surface 228 of each heat exchanging element 224 and returning a hot medium from the surface 228 of each heat exchanging element 224. In one embodiment the cold medium is cold fluid and the hot medium is hot fluid. In this way, the surface 228 of the heat exchanging element 224 is cooled which cools the liquid chemistry 201/gas 216 stream and causes condensation to occur. Such condensation of the liquid chemistry 201/gas 216 prevents loss of the liquid chemistry 201 to evaporation.

According to one embodiment of the present invention, the heat exchanging element 224 is not limited to a particular physical characteristic so long as the heat exchanging element 224 is composed of a material that is capable of conducting heat, is composed of a material that is chemically compatible with the liquid chemistry 201 being used to process the semiconductor wafer surface 212, and a total area of the surface 228 is sufficiently large to provide condensation of the liquid chemistry 201/gas 216 mixture. For example, silicon (Si) is chemically compatible with hydrofluoric acid (HF) chemical solvent and Si also has heat conducting properties. In another embodiment, heat exchanging elements 224 made from heat conducting properties but chemically incompatible materials can be coated with chemically inert materials. And, in the case where the inert coating reduces the overall heat exchange efficiency of the heat exchanging element 224, the total surface area of the heat exchanging element can be increased to compensate for the efficiency loss. In another embodiment, the heat exchanging elements 224 can be monolithically integrated into the proximity head 202 by fabricating the proximity head 202 from a thermally conductive material such as Si (silicon), Al (aluminum), Cu (copper), Sapphire, etc. or combinations thereof, including chemically compatible coatings that can be applied to these materials such as PVDF (Polyvinyldifluoride), Teflon, etc. In this embodiment, cold fluid inlet ports (not shown) and hot fluid outlet ports (not shown) can be coupled to the outlets 220 to provide a heat exchanging mechanism at the inner surfaces 230 of the outlets 220.

Referring still to FIG. 2, the liquid chemistry 201/gas 216 mixture is removed from the semiconductor wafer surface 212 using a vacuum mechanism. Specifically, this vacuum mechanism draws the air 216 and liquid chemistry 201 from the surface 212 of the semiconductor wafer 214 along the outlets 220, out of the proximity head 202, along the vacuum lines 207, and into the vacuum tank 204. At the vacuum tank 204, the liquid chemistry 201 is separated from the air 216 and the air 216 is pumped out of the vacuum tank 204 via an exhaust 228. Reclaim of the liquid chemistry 201 is achieved by recirculation of the liquid chemistry 201 from the vacuum tank 204 back to the supply tank 206 via a liquid pump 208.

Figure 4:
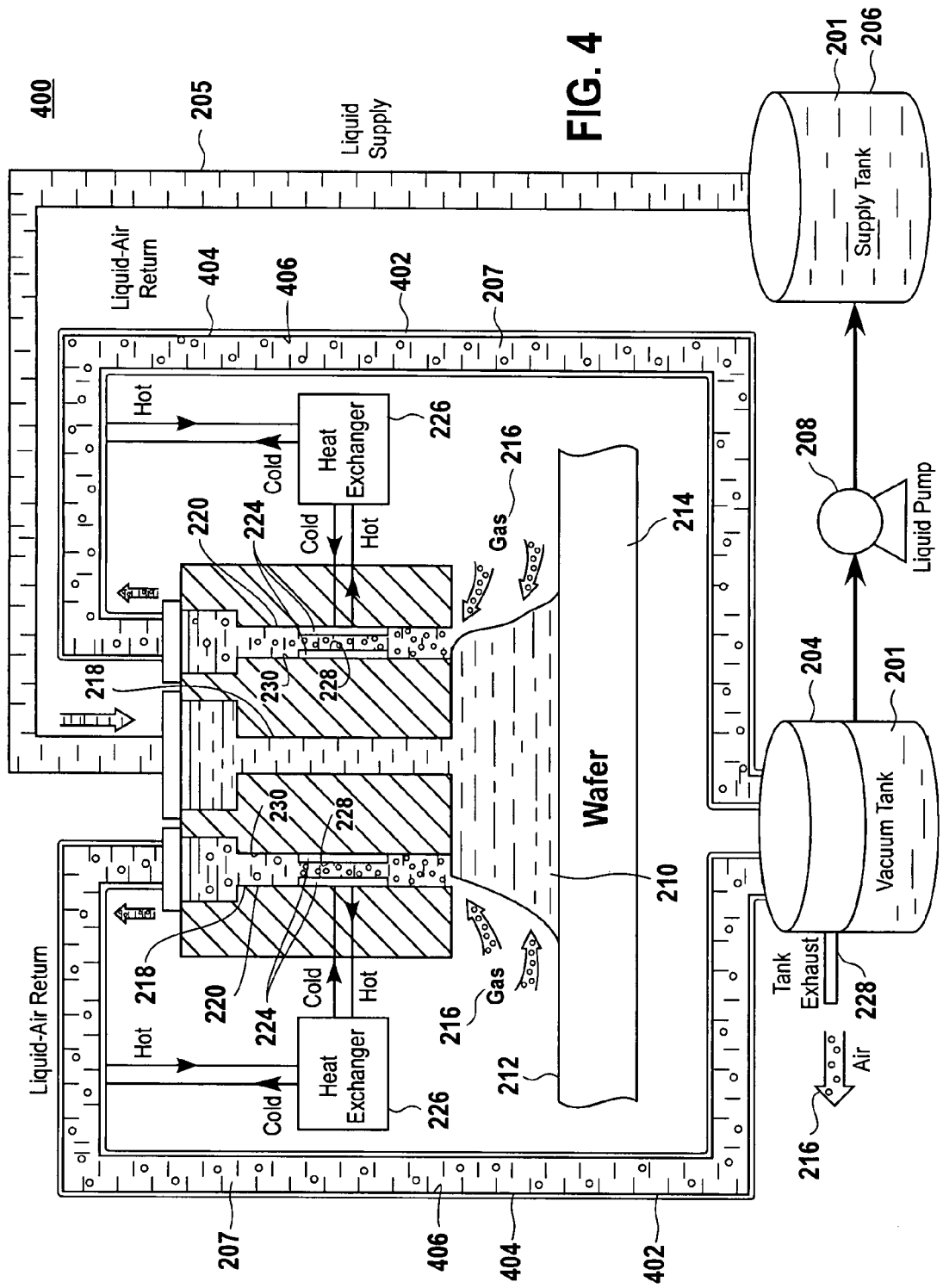
FIG. 4 is a block and cross-sectional view illustration of an alternate in-situ reclaim system, in accordance with one embodiment of the present invention.

In FIG. 4, an alternate embodiment to the system 200 illustrated in FIG. 2 is shown. As shown in FIG. 4, a liquid chemical in-situ reclaim system 400 is illustrated that additionally provides cooling along the vacuum lines 207 between the proximity head 202 and the vacuum tank 204. Specifically, in one embodiment of the present invention, a temperature controlled jacket 402 is coupled around an outer surface 404 of each vacuum line 207 to further cool and provide condensation of the liquid chemistry 201/air 216 stream traveling along the vacuum lines 207. In one embodiment, the temperature controlled jacket 402 is coupled to a heat exchanger 226 that is capable of supplying a cold medium to the temperature controlled jacket 402 and returning a hot medium from the temperature controlled jacket 402. As discussed above in FIG. 2, the cold medium supplied to the temperature controlled jacket 402 from the heat exchanger 226 can be a cold fluid and the hot medium returned from the temperature controlled jacket 402 to the heat exchanger 226 can be a hot fluid. In this way, the inner surface 406 of the vacuum line 207 is cooled which cools the liquid chemistry 201/air 216 stream. As previously discussed, cooling the liquid chemistry 201/air 216 stream causes condensation to occur which prevents evaporation loss of the liquid chemistry 201. In one embodiment, the temperature controlled jacket can be any appropriately chemically-compatible, commercially available unit or a custom-fabricated unit made from typical heat exchanger materials which exhibit appropriate chemical compatibility (e.g. Cu, Al, etc.).

Figure 5:
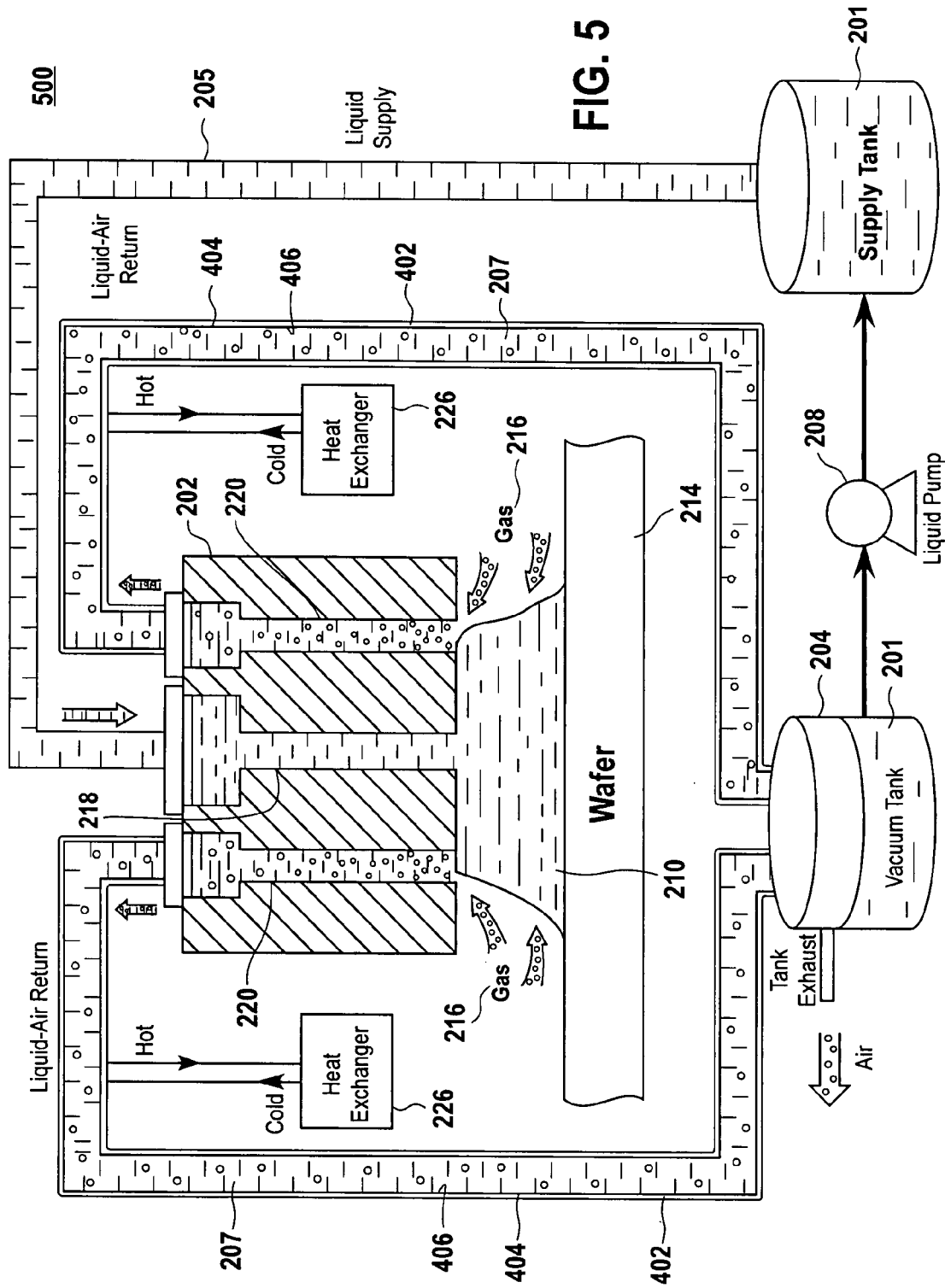
FIG. 5 is a block and cross-sectional view illustration of an alternate in-situ reclaim system, in accordance with one embodiment of the present invention.

In FIG. 5, an alternate embodiment to the system 400 illustrated in FIG. 4 is shown. In FIG. 5, a liquid chemical in-situ reclaim system 500 is shown that only provides cooling along the vacuum lines 207 between the proximity head 202 and the vacuum tank 204. Specifically, as discussed above in FIG. 4, the temperature controlled jacket 402 is coupled around the outer surface 404 of each vacuum line 207 to cool and provide condensation of the liquid chemistry 201/air 216 stream traveling along the vacuum lines 207. In one embodiment, the temperature controlled jacket 402 is coupled to a heat exchanger 226 that is capable of supplying a cold medium to the temperature controlled jacket 402 and returning a hot medium from the temperature controlled jacket 402. As discussed above, the cold medium supplied to the temperature controlled jacket 402 from the heat exchanger 226 can be a cold fluid and the hot medium returned from the temperature controlled jacket 402 to the heat exchanger 226 can be a hot fluid. In this way, the inner surface 406 of the vacuum line 207 is cooled which cools the liquid chemistry 201/air 216 stream. As previously discussed, cooling the liquid chemistry 201/air 216 stream causes condensation to occur which prevents evaporation loss of the liquid chemistry 201.

Figure 6:
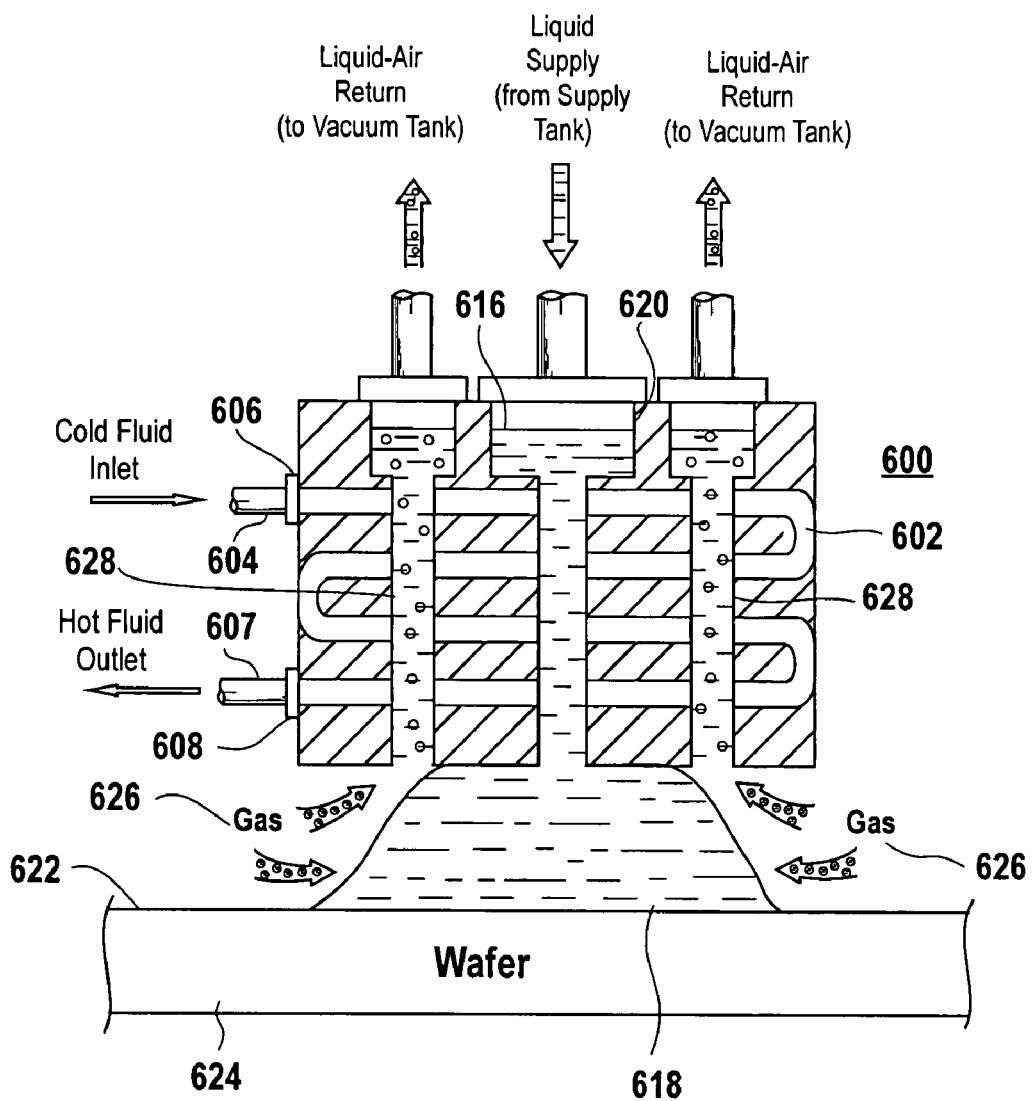
FIG. 6 is a cross-sectional view illustration of a heat exchanging proximity head, in accordance with one embodiment of the present invention.

In FIG. 6, according to one embodiment of the present invention, a heat conducting proximity head 600 is illustrated. In one embodiment, the proximity head 600 is fabricated from a heat conducting (thermally conductive) material and includes a heat conducting channel 602 that is monolithically integrated within the proximity head 600. As discussed above, liquid chemistry 616 is supplied to a meniscus 618 via an inlet 620 of the proximity head 600 where the liquid chemistry 616 travels along the inlet 620 to form the meniscus 618 on a surface 622 of a semiconductor wafer 624. As also discussed above, ambient gas 626 is applied to the chemical meniscus 618 to prevent the meniscus 618 from breaking out of a defined footprint and flooding the semiconductor wafer surface 622 during processing. In one embodiment, an inlet 604 is coupled at an entrance 606 of the heating conducting channel 602 and an outlet 607 is coupled at an exit 608 of the heat conducting channel 602. In one embodiment, the entire proximity head 600 is cooled by circulating a cold fluid into the heat conducting channel 602 at the inlet 604 and removing correspondingly exchanged hot fluid out of the heat conducting channel 602 at the outlet 607. Here, because the entire proximity head 600 functions as a heat exchanger, the gas 626 and liquid chemistry 616 mixing in outlets 628 of the proximity head 600 are cooled to prevent evaporation loss of the liquid chemistry 616. It is important to note that the proximity head 600 can include one or more heating conducting channels 602. Moreover, the proximity head 600 can be fabricated from any heat conducting material that is chemically compatible with the liquid chemistry 616. For example, the proximity head 600 can be fabricated from thermally conductive material including but not limited to Si, Al, Cu, Sapphire (crystalline $Al_2O_3$), or any combinations thereof, including chemically compatible coatings such as PVDF (Polyvinylidifluoride), Teflon, etc. In one embodiment of the present invention, the gas 626 can be ambient air, or inert gases such as nitrogen, helium, argon, etc. Also, the gas 626 can be "spikes" with water vapor or volatile organic components such as ammonia, solvents, etc. However embodiments of the present invention are not limited to a particular type of gas 626.

Figure 7:
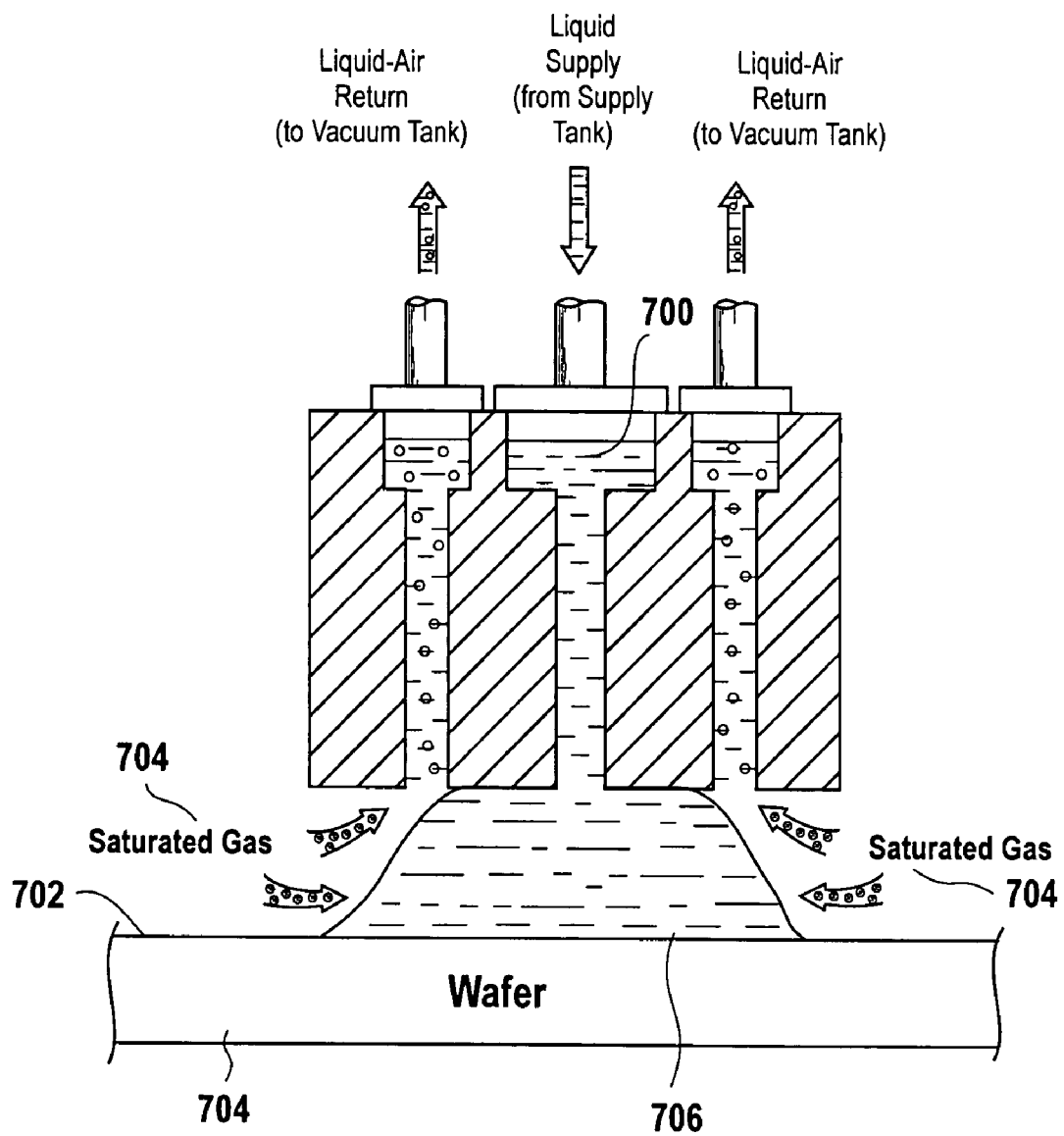
FIG. 7 is an illustration of a method of preventing evaporation loss, in accordance with one embodiment of the present invention.

In FIG. 7, in one embodiment of the present invention, a method of preventing evaporation loss of a liquid chemistry 700 used to process surfaces 702 of semiconductor wafer 704 is provided. According to Henry's Law, at a constant temperature, the amount of a given volatile component dissolved in a given type and volume of liquid is directly proportional to the partial pressure of that component in the gas phase above that liquid. The higher the partial pressure of the volatile component, the higher the equilibrium gas phase concentration will be, and therefore the driving force for the volatile component to "evaporate" out of the liquid will also be correspondingly higher. Conversely, if the gas phase concentration is higher than the equilibrium concentration, the driving force for evaporation of the volatile component will be negligible and the concentration of that component in the liquid will not change. In other words, by saturating the gas with sufficient concentrations of the volatile component to maintain the equilibrium, evaporation of that component can be eliminated.

Specifically, according to one embodiment of the present invention, gas 704 applied to a chemical meniscus 706 to prevent the meniscus 706 from breaking out of a defined footprint and flooding the semiconductor wafer surface 702 is selectively saturated with a component also included in the liquid chemistry 700. For example, ammonia rich liquid chemistry 700 and ammonia gas 704 can be used; water can also be used for aqueous-based chemistries. Again, by saturating the gas 704 with a component that is also present in the liquid chemistry 700, evaporation loss of the liquid chemistry 700 can be prevented at the outset. In one embodiment of the present invention, the gas 704 can be ambient air or inert gases such a nitrogen, helium, argon, etc. However embodiments of the present invention are not limited to a particular gas 704. In one embodiment of the present invention the component can be ammonia, hydrofluoric acid (HF), hydrogen peroxide, hydrochloric acid, surfactants, buffers, catalysts, chelating agents, etc.

In view of the discussion above, is should be apparent that embodiments of the present invention provide a capability to reclaim evaporated liquid chemistry components before these components ever leave a reclaim system. Embodiments of the present invention also eliminate the extra tanks, pumps, etc. that are needed when volatile components are condensed out of conventional reclaim systems. Moreover, embodiments of the present invention eliminate the need for evaporation compensation strategies such as concentration monitoring and chemical spiking.

It should be appreciated that the systems and proximity heads as described herein are exemplary in nature, and that any other suitable types of configurations that would enable the generation and movement of a meniscus or enable a meniscus with a cavity enclosed therein may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In other embodiments, either or both of the wafer and the proximity head do not move depending on the wafer processing operation and the configuration of the proximity head. In further embodiments, the proximity head may be held stationary and the wafer may be moved to be processed by the fluid meniscus. As with the proximity head, the wafer may move in any suitable motion as long as the desired wafer processing operation is accomplished.

In addition, the proximity head and the wafer processing system as described herein may be utilized to process any shape and size of substrates such as for example, 200 mm wafers, 300 mm wafers, flat panels, etc. Moreover, the size of the proximity head and in turn the sizes of the menisci may vary. In one embodiment, the size of the proximity head and the sizes of the menisci may be larger than a wafer being processed, and in another embodiment, the proximity head and the sizes of the menisci may be smaller than the wafer being processed. Furthermore, the menisci as discussed herein may be utilized with other forms of wafer processing technologies such as, for example, brushing, lithography, megasonics, etc.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A fluid reclaim system, comprising:
   a proximity head for generating a fluid meniscus on a surface of a wafer between the surface of the wafer and a surface of the proximity head, the proximity head including,
   a head body;
   inlets in the head body for supplying a fluid chemistry for defining the fluid meniscus;
   outlets in the head body, the outlets arranged in a surrounding configuration around the inlets for removing the fluid meniscus from the wafer surface, wherein removal of the fluid meniscus creates a mixture of gas and the fluid chemistry within the outlets in the head body;
   a heat exchanging element thermally coupled to an inner surface of the outlets in the head body, wherein the heat exchanging element is coupled to fluid inlet ports and fluid outlet ports for coupling a cold medium to the inner surface of the outlets, for cooling the mixture of the gas and the fluid chemistry to prevent evaporation loss of the fluid chemistry in the outlets in the head body, the heat exchanging element is coupled to a heat exchanger via the fluid inlet and outlet ports, and the outlets are connected to a vacuum tank for receiving the fluid chemistry in a cooled state; and
   a vacuum line coupled to the at least one outlet for removing the fluid chemistry in the cooled state to the vacuum tank, the vacuum line further including a jacket defined around at least part of an outer surface of the vacuum line, the jacket providing temperature control for the mixture of the gas and the fluid chemistry traveling along the vacuum line to the vacuum tank, and the jacket is a temperature-controlling jacket coupled to a heat exchanger.

2. The system as recited in claim 1, wherein the surface of the heat exchanging element is configured to contact the mixture of the gas and the fluid chemistry.

3. The system as recited in claim 1, wherein the heat exchanging element is composed of a heat conducting material.

4. The system as recited in claim 1, wherein the heat exchanging element is composed of a material that is chemically compatible with the fluid chemistry or has a chemically compatible coating applied thereto.

5. The system as recited in claim 1, further comprising:
   a supply tank coupled to the inlets via a supply line, wherein the fluid chemistry is supplied from the supply tank to the at least one inlet along the supply line.

6. The system as recited in claim 1, wherein the heat exchanger is configured for supplying a cold medium to the temperature-controlling jacket and returning a hot medium from the temperature-controlling jacket.

7. The system as recited in claim 1, wherein the gas is ambient air or inert gases such as nitrogen, helium, or argon.

8. A system, comprising:
   (a) a proximity head for generating a fluid meniscus on a surface of a wafer between the surface of the wafer and a surface of the proximity head, the proximity head has a head body that includes,
   (i) a plurality of inlets for supplying a fluid chemistry and a plurality of outlets, for removing the fluid chemistry from the fluid meniscus on the wafer surface, the plurality of outlets disposed on the surface of the proximity head to surround the plurality of inlets, and removal of the fluid chemistry creates a mixture of air and the fluid chemistry in the plurality of outlets in the head body,
   (ii) a heat exchanging element thermally coupled to an inner surface of the plurality of outlets in the head body, wherein the heat exchanging element cools the mixture of the air and the fluid chemistry to reduce evaporation loss of the fluid chemistry inside the plurality of outlets that are inside the head body, the heat exchanging element being coupled to a heat exchanger by way of inlet ports and outlet ports that communicate a cooling medium to the head exchanging element for cooling the mixture of the gas and the fluid chemistry to prevent evaporation loss of the fluid chemistry in the outlets in the head body;
   (b) a vacuum tank connected to the plurality of outlets through vacuum lines, the vacuum lines being connected to the heat exchanger, the vacuum tank receiving the fluid chemistry in a cooled state after flowing out of the plurality of outlets and the vacuum lines;
   (c) a pump connected to the vacuum tank; and
   (d) a supply tank coupled to the pump, to receive the fluid chemistry from the vacuum tank.

9. A system, comprising:
   a proximity head, having a head body, with a plurality of inlets for supplying a fluid chemistry and a plurality of outlets defined in the head body for generating a fluid meniscus between a surface of the head body of the proximity head and a surface of a wafer, each of the plurality of inlets being coupled to a single supply of chemistry, and wherein the plurality of outlets are defined to surround the plurality of inlets, wherein removal of the fluid meniscus through the outlets creates a mixture of gas and fluid chemistry within the outlets,
   each of the plurality of outlets in the head body being thermally coupled to heat exchanging elements, each of the heat exchanging elements being coupled to a heat exchanger via fluid inlet ports and fluid outlet ports for communicating a cooling medium for cooling the mixture of the gas and the fluid chemistry to prevent evaporation loss of the fluid chemistry in the outlets in the head body, the heat exchanging elements reside inside of the head body;
   a plurality of vacuum lines connected between the plurality of outlets of the proximity head and a vacuum tank.

10. The system of claim 9, further comprising:
    a jacket for the vacuum lines, the jacket being thermally controlled.

11. The system of claim 9, wherein the heat exchanging elements are composed of a material that is chemically compatible with a fluid chemistry or has a chemically compatible coating applied thereto.

* * * * *